United States Patent
Lee et al.

(10) Patent No.: US 11,244,442 B2
(45) Date of Patent: *Feb. 8, 2022

(54) METHOD AND SYSTEM FOR CORRELATING OPTICAL IMAGES WITH SCANNING ELECTRON MICROSCOPY IMAGES

(71) Applicant: KLA-Tencor Corporation, Milpitas, CA (US)

(72) Inventors: Hucheng Lee, Cupertino, CA (US); Lisheng Gao, Morgan Hill, CA (US); Jan Lauber, San Francisco, CA (US); Yong Zhang, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 16/508,778

(22) Filed: Jul. 11, 2019

(65) Prior Publication Data

US 2019/0333206 A1 Oct. 31, 2019

Related U.S. Application Data

(63) Continuation of application No. 14/506,407, filed on Oct. 3, 2014, now Pat. No. 10,410,338.
(Continued)

(51) Int. Cl.
*G06T 7/00* (2017.01)
*G06T 5/00* (2006.01)
(Continued)

(52) U.S. Cl.
CPC .............. *G06T 7/001* (2013.01); *G06T 5/00* (2013.01); *H01J 37/222* (2013.01); *H01J 37/28* (2013.01);
(Continued)

(58) Field of Classification Search
None
See application file for complete search history.

(56) References Cited

U.S. PATENT DOCUMENTS 6,407,373 B1  6/2002  Dotan
6,583,634 B1  6/2003  Nozoe et al.
(Continued)

FOREIGN PATENT DOCUMENTS

JP    2008039533 A    2/2008
JP    2011039013 A    2/2011
JP         5303781 B2 *  10/2013  .............. H01J 37/28

OTHER PUBLICATIONS

Bushong, Eric A., et al. "X-ray microscopy as an approach to increasing accuracy and efficiency of serial block-face imaging for correlated light and electron microscopy of biological specimens." Microscopy and microanalysis 2015 (Year: 2015).*
(Continued)

*Primary Examiner* — Michelle M Entezari
(74) *Attorney, Agent, or Firm* — Suiter Swantz pc llo

(57) ABSTRACT

The correlation of optical images with SEM images includes acquiring a full optical image of a sample by scanning the sample with an optical inspection sub-system, storing the full optical image, identifying a location of a feature-of-interest present in the full optical image with an additional sources, acquiring an SEM image of a portion of the sample that includes the feature at the identified location with a SEM tool, acquiring an optical image portion at the location identified by the additional source, the image portions including a reference structure, correlating the image portion and the SEM image based on the presence of the feature-of-interest and the reference structure in both the image portions and the SEM image, and transferring a location of the feature-of-interest in the SEM image into the coordinate
(Continued)

system of the image portion of the full optical image to form a corrected optical image.

24 Claims, 10 Drawing Sheets

Related U.S. Application Data

(60) Provisional application No. 61/899,872, filed on Nov. 4, 2013.

(51) Int. Cl.
    *H01J 37/22* (2006.01)
    *H01J 37/28* (2006.01)

(52) U.S. Cl.
    CPC ............ *G06T 2207/10061* (2013.01); *G06T 2207/30148* (2013.01)

(56) References Cited

U.S. PATENT DOCUMENTS

| | | | |
|---|---|---|---|
| 7,294,833 B2 | 11/2007 | Konno et al. | |
| 7,570,796 B2 | 8/2009 | Zafar et al. | |
| 7,676,007 B1 | 3/2010 | Choi et al. | |
| 7,903,867 B2 | 3/2011 | Nakahira et al. | |
| 7,907,761 B2 | 3/2011 | Subramanian et al. | |
| 8,035,082 B2 * | 10/2011 | Yamazaki | G01N 23/2251 250/310 |
| 8,041,103 B2 | 10/2011 | Kulkarni et al. | |
| 8,139,843 B2 | 3/2012 | Kulkarni et al. | |
| 8,339,450 B2 | 12/2012 | Takahashi | |
| RE44,035 E * | 3/2013 | Schamber | H01J 37/226 250/492.1 |
| RE55,035 | 3/2013 | Schamber et al. | |
| 9,092,846 B2 | 7/2015 | Wu et al. | |
| 9,817,320 B2 * | 11/2017 | Borges Nicolau | G03F 7/70425 |
| 10,586,676 B2 * | 3/2020 | Kato | H01J 37/28 |
| 2003/0025087 A1 | 2/2003 | Schamber et al. | |
| 2004/0046120 A1 | 3/2004 | Moses et al. | |
| 2006/0017014 A1 * | 1/2006 | Shinada | H01J 37/244 250/492.1 |
| 2006/0104500 A1 * | 5/2006 | Obara | G01N 21/9501 382/145 |
| 2008/0015802 A1 | 1/2008 | Urano et al. | |
| 2008/0058977 A1 | 3/2008 | Honda | |
| 2009/0097020 A1 | 4/2009 | Treado et al. | |
| 2010/0235134 A1 | 9/2010 | Xiong | |
| 2011/0044529 A1 * | 2/2011 | Tsuchiya | G03F 1/84 382/144 |
| 2011/0181701 A1 | 7/2011 | Varslot et al. | |
| 2011/0286656 A1 | 11/2011 | Kulkarni et al. | |
| 2011/0296362 A1 | 12/2011 | Ishikawa et al. | |
| 2011/0299752 A1 | 12/2011 | Sun | |
| 2012/0262584 A1 | 10/2012 | Strandemar | |
| 2013/0010100 A1 | 1/2013 | Kotaki et al. | |
| 2013/0083318 A1 | 4/2013 | Ogawa | |
| 2013/0279790 A1 | 10/2013 | Kaizerman et al. | |
| 2013/0292568 A1 | 11/2013 | Bizen et al. | |
| 2013/0343632 A1 * | 12/2013 | Urano | G06T 7/001 382/149 |
| 2015/0108350 A1 * | 4/2015 | Hoogenboom | H01J 37/22 250/307 |
| 2015/0170355 A1 | 6/2015 | Yoshida | |
| 2015/0302542 A1 | 10/2015 | Sturgill et al. | |
| 2016/0210526 A1 | 7/2016 | Lee et al. | |

OTHER PUBLICATIONS

Mello, A. W., et al. "Distortion correction protocol for digital image correlation after scanning electron microscopy: emphasis on long duration and ex-situ experiments." Experimental Mechanics 57.9 (2017): 1395-1409. (Year: 2017).*

Kammers, Adam D., and Samantha Daly. "Digital image correlation under scanning electron microscopy: methodology and validation." Experimental Mechanics 53.9 (2013): 1743-1761. (Year: 2013).*

Machine Translation JP 5303781 B2 (Year: 2013).*

Office Action in Korean Application No. 10-2020-7032627 dated Apr. 13, 2021, 15 pages (with English Translation).

\* cited by examiner

METHOD AND SYSTEM FOR CORRELATING OPTICAL IMAGES WITH SCANNING ELECTRON MICROSCOPY IMAGES

CROSS-REFERENCE TO RELATED APPLICATION

The present application is related to and claims benefit of the earliest available effective filing date from the following applications: The present application constitutes a continuation application of U.S. patent application Ser. No. 14/506,407, filed Oct. 3, 2014, entitled METHOD AND SYSTEM FOR CORRELATING OPTICAL IMAGES WITH SCANNING ELECTRON MICROSCOPY IMAGES, which is a regular (non-provisional) patent application of U.S. Provisional Patent Application Ser. No. 61/899,872, filed Nov. 4, 2013, entitled AUTOMATIC DOI SENSITIVITY ASSESSMENT AND SEM NON-VISUAL VERIFICATION FOR INSPECTION USING IMAGE PROCESSING TECHNIQUES whereby each of the above-listed patent applications is incorporated herein by reference in their entirety.

TECHNICAL FIELD

The present invention generally relates to the correlation of optical images with scanning electron images and, in particular, the correlation of optical images obtained via a wafer inspection tool and scanning electron microscopy images obtained with a scanning electron microscopy review tool.

BACKGROUND

Assessing the sensitivity of an optical inspection system for a patterned wafer is generally a manual, slow process. Currently, a human operator must obtain defect locations from another source, such as an electronic beam inspector (eBI) or a scanning electron microscope (SEM). The user then must manually locate the defects on the wafer in the event the inspection system is sensitive to some of the defects, such as particles, or, alternatively, the user may manually create a SEM burn mark proximate to the defect locations. Burning a SEM mark on a wafer is not always possible since the optical images are obtained from a previous process step. SEM non-visual verification relies heavily on the defect location accuracy (DLA) of SEM review tools thus making it desirable to provide a system and method which provides quick, accurate defect locations based upon optical inspector results.

SUMMARY

A method for correlating optical images with scanning electron microscopy images is disclosed, in accordance with one illustrative embodiment of the present disclosure. In one illustrative embodiment, the method includes acquiring one or more full optical images of a sample by scanning the sample with an optical inspection sub-system. In another illustrative embodiment, the method includes storing the one or more full optical images. In another illustrative embodiment, the method includes identifying a location of one or more features-of-interest present in the one or more acquired full optical images with one or more additional sources. In another illustrative embodiment, the method includes acquiring one or more scanning electron microscopy images of a portion of the sample including the one or more features at the identified location with a scanning electron microscopy tool. In another illustrative embodiment, the method includes acquiring one or more image portions of the one or more full optical images including the one or more features-of-interest at the location identified by the one or more additional sources, the one or more image portions including one or more reference structures. In another illustrative embodiment, the method includes correlating the one or more image portions and the one or more scanning electron microscopy images based on the presence of at least one of the one or more features-of-interest and the one or more reference structures in both the one or more image portions and the one or more scanning electron microscopy images. In another illustrative embodiment, the method includes transferring a location of the one or more features-of-interest in the one or more scanning electron microscopy images into the coordinate system of the one or more image portions of the one or more full optical images to form one or more corrected optical images.

A method for correlating optical images with scanning electron microscopy images is disclosed, in accordance with one illustrative embodiment of the present disclosure. In one illustrative embodiment, the method includes acquiring one or more full optical images of a sample by scanning the sample with an optical inspection tool. In another illustrative embodiment, the method includes storing the one or more full optical images. In another illustrative embodiment, the method includes identifying a location of one or more features-of-interest present in the one or more acquired full optical images with one or more additional sources. In another illustrative embodiment, the method includes acquiring one or more scanning electron microscopy images of a portion of the sample including the one or more features at the identified location with a scanning electron microscopy tool. In another illustrative embodiment, the method includes acquiring one or more image portions of the one or more full optical images including the one or more features-of-interest at the location identified by the one or more additional sources, the one or more image portions including one or more reference structures. In another illustrative embodiment, the method includes scaling at least one of the one or more image portions and the one or more scanning electron microscopy images in order to substantially match the resolution of the one or more image portions with the resolution of the one or more scanning electron microscopy images (e.g., rescaling so that optical image and SEM image have matching pixel sizes). In another illustrative embodiment, the method includes correlating the resolution matched one or more image portions and the one or more scanning electron microscopy images based on the presence of at least one of the one or more features-of-interest and the one or more reference structures in both the one or more image portions and the one or more scanning electron microscopy images. In another illustrative embodiment, the method includes transferring a location of the one or more features-of-interest in the one or more scanning electron images into the coordinate system of the one or more image portions of the one or more full optical images to form one or more corrected optical images.

A system for correlating optical images with scanning electron microscopy images is disclosed, in accordance with one illustrative embodiment of the present invention. In one illustrative embodiment, the system includes an inspection sub-system for acquiring one or more optical inspection images from a surface of a wafer. In one illustrative embodiment, the system includes a scanning electron microscopy tool sub-system for acquiring one or more measurement inspection images from the surface of the wafer. In one illustrative embodiment, the system includes a controller communicatively coupled to at least one of the inspection sub-system and scanning electron microscopy tool. In one illustrative embodiment, the controller includes one or more processors configured to execute a set of programmed instructions, the programmed instructions configured to cause the one or more processors to: acquire one or more full optical images of a sample by scanning the sample with the optical inspection sub-system; store the one or more full optical images in one or more memory units; identify a location of one or more features-of-interest present in the one or more acquired full optical images with one or more additional sources; acquire one or more scanning electron microscopy images of a portion of the sample including the one or more features at the identified location with the scanning electron microscopy tool; store the one or more scanning electron microscopy images in the one or more memory units; acquire one or more image portions of the one or more full optical images including the one or more features-of-interest at the location identified by the one or more additional sources, the one or more image portions including one or more reference structures; correlate the one or more image portions and the one or more scanning electron microscopy images based on the presence of at least one of the one or more features-of-interest and the one or more reference structures in both the one or more image portions and the one or more scanning electron microscopy images; and transfer a location of the one or more features-of-interest in the one or more scanning electron microscopy images into the coordinate system of the one or more image portions of the one or more full optical images to form one or more corrected optical images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 3, a system and method for-correlating optical images of a sample with scanning electron microscope (SEM) images of the sample is described in accordance with the present disclosure. Some embodiments of the present disclosure are directed to the correlation of optical images and SEM images using defect location information from an additional source (e.g., SEM, electrical test results and the like). Additional embodiments of the present disclosure are directed to the assessment of sensitivity of an optical inspection tool to a features-of-interest (e.g., defects or patterns-of-interest) using various defect detection algorithms and detection modes. Further embodiments of the present disclosure are directed to automatic SEM non-visual verification on a SEM review tool using results from an optical inspector. Determining the sensitivity of an optical inspection tool as a function of various inspection configurations allows a user (or controller) to optimize, or at least enhance, the parameters of the inspection process. As such, the present invention allows for improved sensitivity, which in turn increases the capture rate of the features-of-interest. Additional embodiments of the present disclosure are directed to automatic care area generation that limits the inspection to a specific area around the expected defect locations.

Figure 1A:
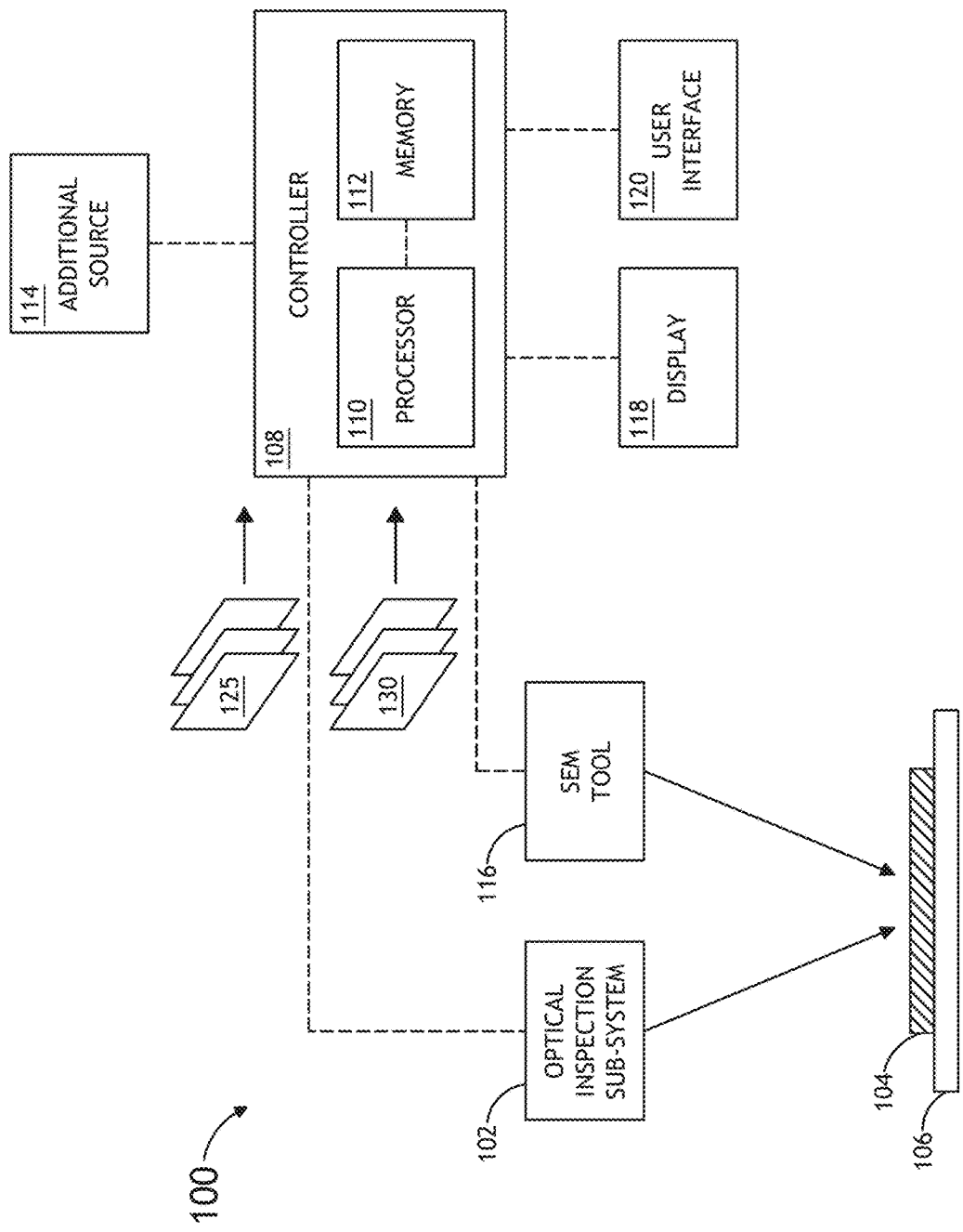
FIG. 1A illustrates a block diagram view of a system for correlating optical images and scanning electron microscopy images, in accordance with the present invention.
Figure 1B:
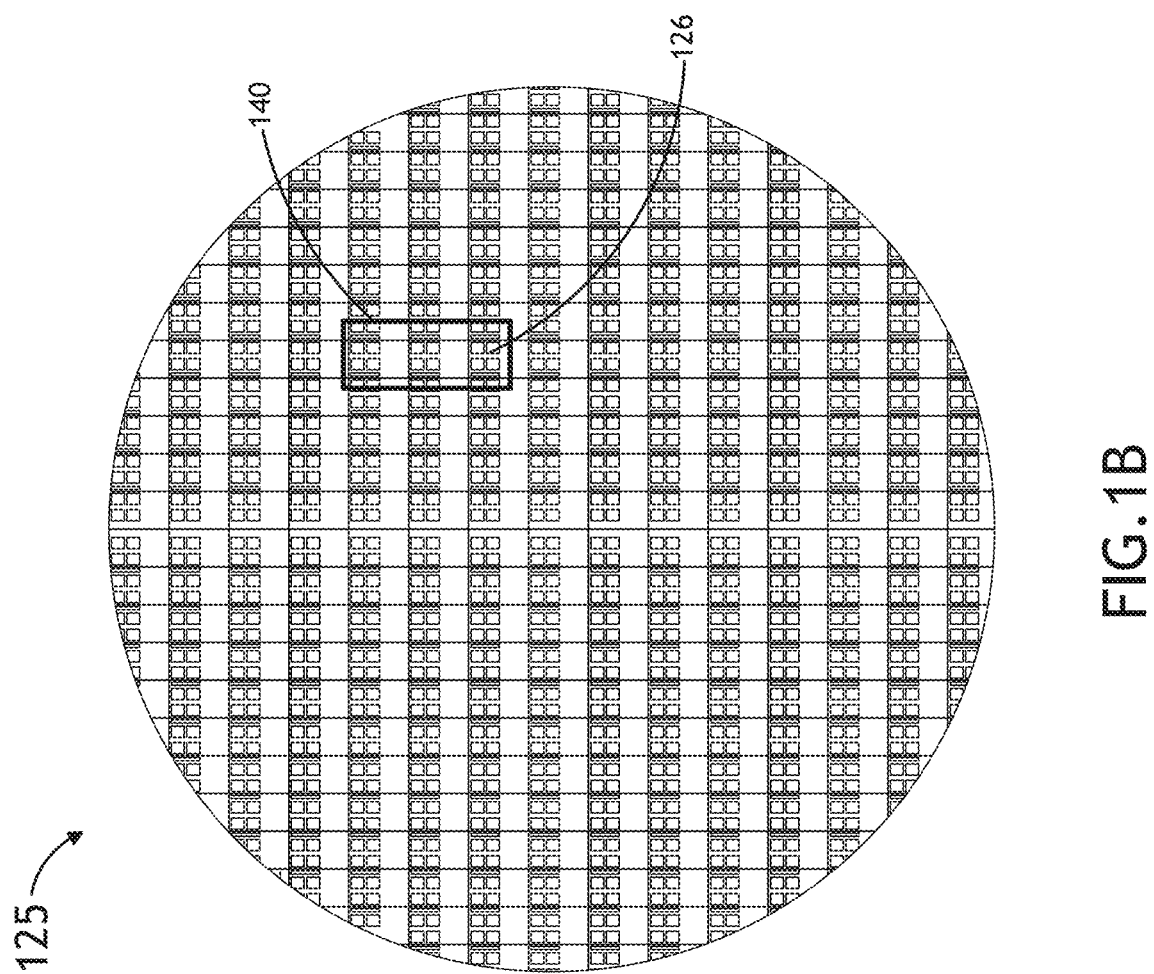
FIG. 1B illustrates a conceptual view of a full wafer image, in accordance with the present invention.

FIG. 1A-1G illustrate a system 100 for correlating optical images of a sample with scanning electron microscopy images of the sample, in accordance with one embodiment of the present disclosure. The system 100 may include an optical inspection sub-system 102. In one embodiment, the optical inspection sub-system 102 is suitable for acquiring one or more full optical images 125 of a sample 104, such as a wafer, as shown in FIG. 1B. For example, the optical inspection sub-system 102 may acquire one or more full optical images of a sample 104 disposed on a stage 106 by scanning the sample 104 (e.g., spiral scanning, linear scanning and the like). For instance, the inspection sub-system 102 may scan sample 104 in order to obtain image 125, which includes one or more features-of-interest (FOI) 126, such as, but not limited to, a defect or pattern-of-interest. It is noted herein that a given FOI 126 may or may not be visible in the full wafer image 125.

As used throughout the present disclosure, a "wafer" or, more generally, a "sample" may refer to a substrate formed of a semiconductor or non-semiconductor material. For example, a semiconductor or non-semiconductor material may include, but is not limited to, monocrystalline silicon, gallium arsenide, or indium phosphide. A wafer may include one or more layers. For example, such layers may include, but are not limited to, a resist, a dielectric material, a conductive material, or a semiconductive material. Many different types of such layers are known in the art, such as, but not limited to, isolation layers, implantation layers, and the like. The terms "wafer" and "sample" as used herein are intended to encompass a substrate on which any of such layers may be formed.

It is noted herein that for the purposes of the present disclosure the term 'full image' may be interpreted as an image that encompasses an entire wafer or encompasses an entire area of interest (AOI) of a wafer.

In one embodiment, the inspection sub-system 102 stores the full image 125. For example, the inspection sub-system 102 may store the full image 125 in memory. For instance, the inspection sub-system 102 may store the full image 125 in memory onboard inspection sub-system 102 or in a memory external to the inspection sub-system (e.g., memory 112 of controller 108).

In one embodiment, the inspection sub-system 102 may include any optical inspection tool known in the art of sample (e.g., semiconductor wafer) inspection. For instance, the optical inspection sub-system 102 may include, but is not limited to, a darkfield (DF) inspection tool or brightfield (BF) inspection tool. Further, the optical inspection sub-system 102 may employ one or more broadband light sources (e.g., broadband plasma light source or broadband discharge lamp) or one or more narrowband light sources (e.g., one or more lasers).

In another embodiment, the system 100 includes a controller 108, or computer control system. In one embodiment, the controller 108 includes one or more processors 110 and memory 112. In one embodiment, the one or more processors 110 of controller 108 are communicatively coupled to the optical inspection sub-system 102. In this regard, the one or more processors 110 of controller 108 may receive the acquired full optical image 125 from the optical inspection sub-system 102 and store the image 125 in memory 112.

In another embodiment, the controller 108 (e.g., one or more processors 110) is configured to receive FOI location information associated with the one or more FOIs in the full optical image 125. In one embodiment, the one or more processors 110 are communicatively coupled to one or more additional sources 114. In one embodiment, the one or more additional sources 114 identify a location of one or more FOIs 126 present in the one or more acquired full optical images 125 using one or more additional sources 114. For example, the one or more additional sources 114 may include, but are not limited to, an electronic beam inspector (eBI), a scanning electron microscopy (SEM) review tool, an electronic test tool and the like.

In another embodiment, the one or more additional sources 114 may include a source (e.g., memory) of design data, which includes design data associated with the devices of the sample 104. It is noted herein that the use of design data may aid a user and/or controller 108 in identifying regions of the device design having a higher propensity for defects. The term "design data" as used in the present disclosure generally refers to the physical design of an integrated circuit and data derived from the physical design through complex simulation or simple geometric and Boolean operations. In addition, an image of a reticle acquired by a reticle inspection system and/or derivatives thereof may be used as a proxy or proxies for the design data. Such a reticle image or a derivative thereof may serve as a substitute for the design layout in embodiments described herein that use design data. Design data and design data proxies are described in U.S. Pat. No. 7,676,007 by Kulkarni issued on Mar. 9, 2010; U.S. patent application Ser. No. 13/115,957 by Kulkarni filed on May 25, 2011; U.S. Pat. No. 8,041,103 by Kulkarni issued on Oct. 18, 2011; and U.S. Pat. No. 7,570,796 by Zafar et al. issued on Aug. 4, 2009, all of which are incorporated herein by reference.

Utilizing the approaches outlined herein the one or more additional sources 114 may identify a location of an FOI 126 on the sample 104 independent from the optical inspection image 125.

Figure 1D:
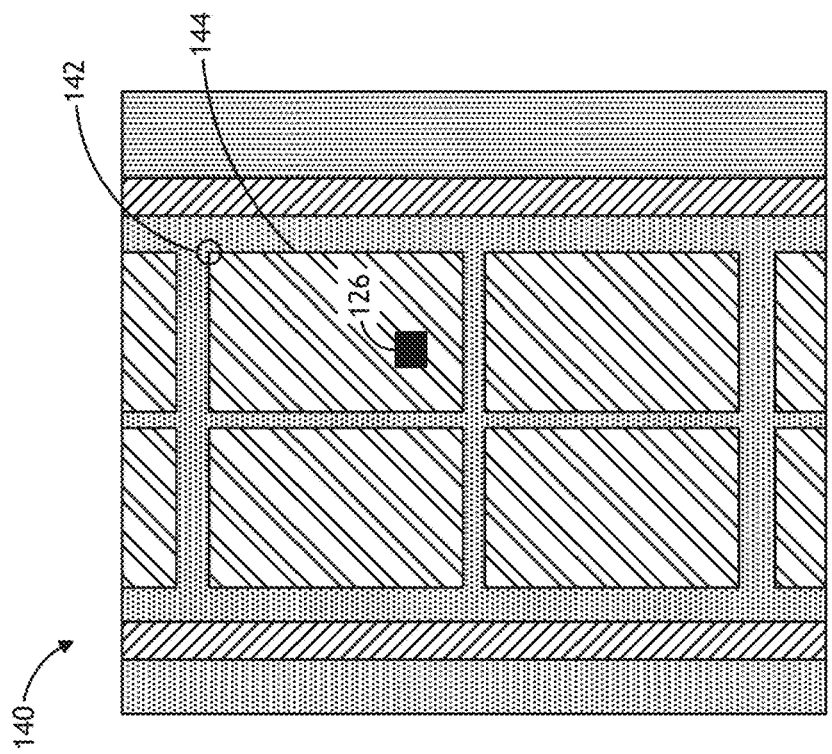
FIG. 1D illustrates a conceptual view of an image portion of a full wafer image, in accordance with the present invention.
Figure 1C:
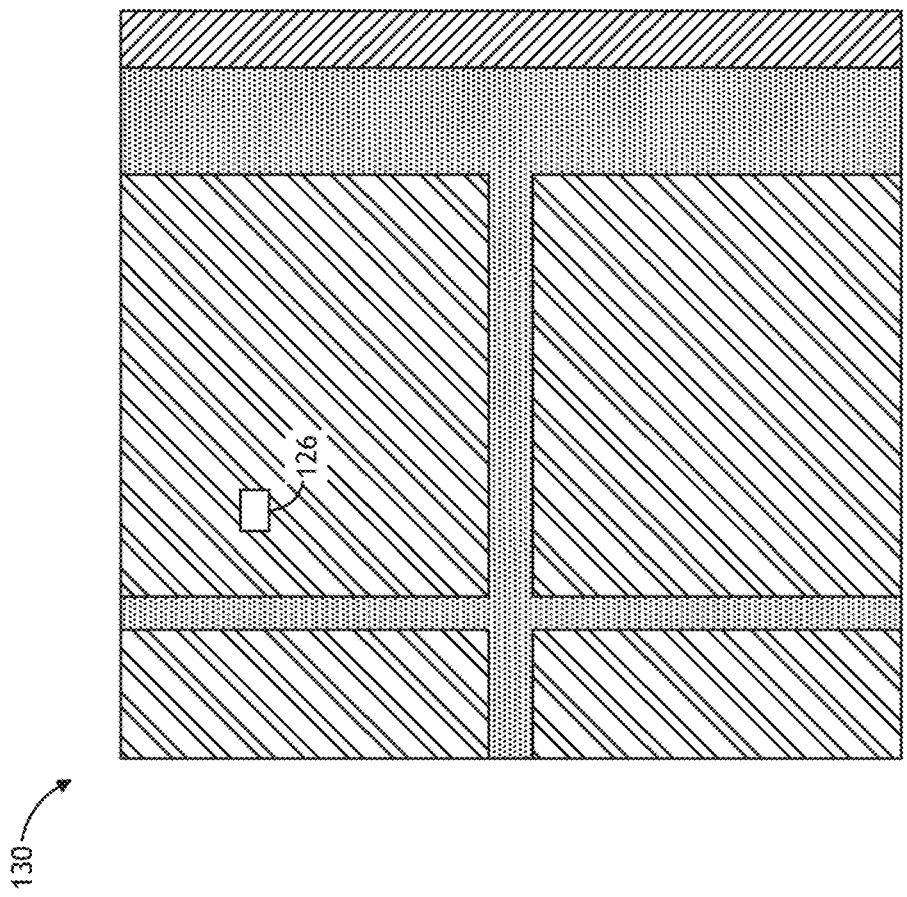
FIG. 1C illustrates a conceptual view of a scanning electron microscopy image, in accordance with the present invention.

In another embodiment, the system 100 includes a SEM tool 116. In one embodiment, the SEM tool 116 is configured to acquire one or more SEM images 130 of a portion of the sample 104 including the one or more features-of-interest 126 at the location identified by the additional source 114. FIG. 1C illustrates a conceptual view of a SEM image containing a FOI 126 initially identified by the additional source 114. It is noted herein that the SEM tool 116 may include any SEM tool known in the art of semiconductor wafer inspection. In another embodiment, the SEM tool 116 is communicatively coupled to the controller 108 and is configured to transfer SEM acquisition results to the controller 108. In turn, the one or more processors 110 of controller 108 may store the acquired SEM images 130 from the SEM tool 116 in memory 112.

In another embodiment, the controller 108 may be configured to acquire one or more image portions 140 of the one or more full optical images 125. For example, the controller 108 may grab from a memory one or more image portions 140 including the one or more features-of-interest 126 at the location identified by the one or more additional sources 114. In addition, the image portion 140 grabbed by controller 108 may have a field of view (FOV) large enough that it contains one or more reference structures (e.g., memory block corner 142 or memory block border 144) and the one or more features-of-interest 126, as shown in FIG. 1D.

Figure 1E:
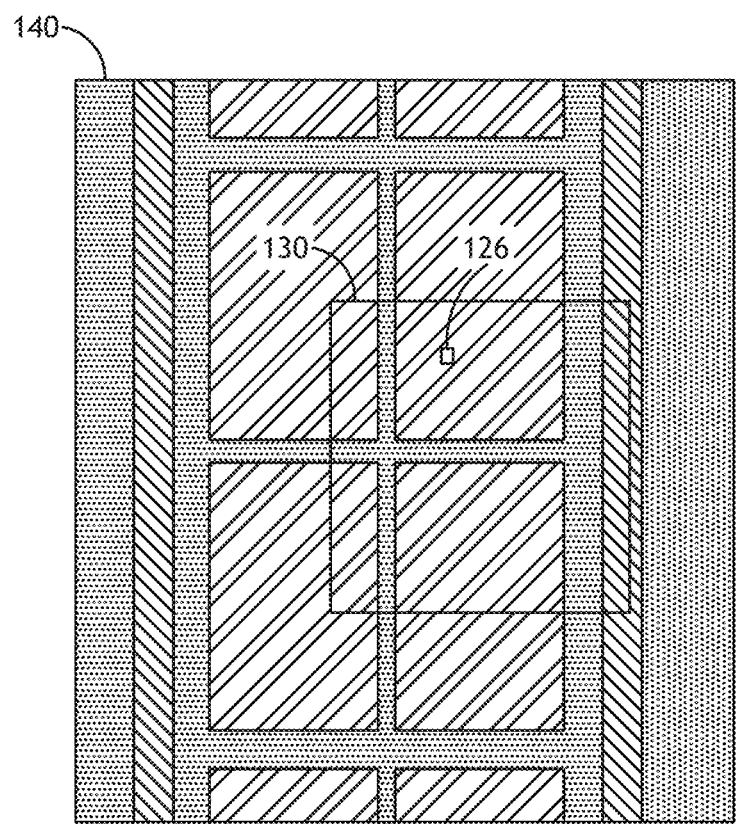
FIG. 1E illustrates a conceptual view of a scanning electron microscopy image superposed on an image portion of a full wafer image, in accordance with the present invention.

In one embodiment, the controller 108 may correlate the one or more image portions 140 with the one or more scanning electron microscopy images 130. In one embodiment, the correlation is based on the presence of one or more features-of-interest 126 and/or the one or more reference structures (e.g., corner 142 or border 144) in both the one or more image portions 140 and the one or more scanning electron microscopy images 130. In another embodiment, as outlined in method 300, prior to correlating the images, the controller 108 may perform a re-scaling process on the one or more image portions 140 and the one or more SEM images 130 in order to match the resolution of the one or more image portions 140 with the resolution of the one or more SEM images 130. For example, as shown in FIG. 1E, a scaled SEM image 130 is superposed onto the image portion 140 of the full wafer image 125, graphically depicting the correlation between the SEM image 130 and the image portion 140.

In another embodiment, the controller 108 may transfer a location of the one or more features-of-interest 126 in the one or more SEM images 130 into the coordinate system of the one or more image portions 140 of the one or more full optical images 125 to form one or more corrected optical images. In another embodiment, a new image file (e.g., KLARF file) may be generated that includes the corrected locations of the one or more features-of-interest (e.g., defects).

Figure 1F:
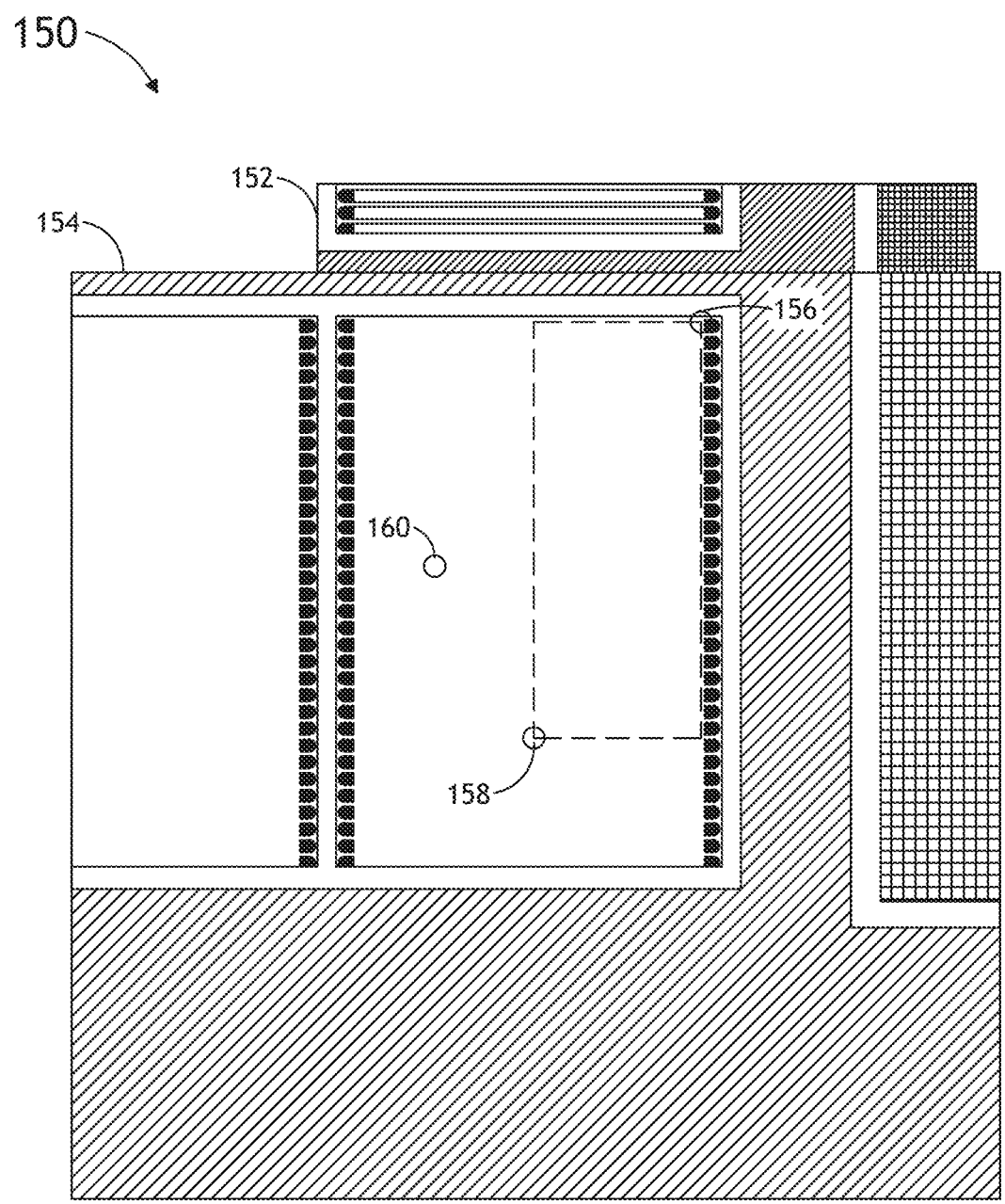
FIG. 1F illustrates a conceptual view of a scanning electron microscopy image aligned with an image portion of a full wafer image, in accordance with the present invention.

It is noted herein that, while the FOI location 126 in SEM image 130 may be accurate, the FOI location 126 in the optical image portion 140 is acquired from additional source 114 (e.g., acquired in a Klarf format). It is further recognized that the FOI location 126 based on the additional source may be incorrect due to different stage accuracies between additional source 114 and optical inspection sub-system 102. As shown in FIG. 1F, the FOI location in optical image 154 based on an image file (e.g., KLARF file) from additional source 114 is at location 160, but the correct location of FOI based on low mag SEM image 152 should be at location 158 following SEM-optical image correlation. In one embodiment, the FOI location 158 may be transferred to optical image 154 and used to evaluate the sensitivity of optical inspection sub-system to the given FOI, while the original FOI location 160 may be discarded. In one embodiment, SRAM corners, such as 156, may serve as the primary anchor points for SEM-optical image correlation, although the present disclosure is not limited to SRAM structure features for the purposes of SEM-optical image correlation.

In another embodiment, the controller 108 may process the one or more corrected optical images with a plurality of features-of-interest detection procedures. In another embodiment, the controller 108 may determine a sensitivity of the optical inspection sub-system to the one or more features-of-interest for each of the features-of-interest detection procedures and/or optical detection mode. For example, the controller 108 may apply multiple defect detection algorithms to the corrected images. Further, based on the application of the multiple defect detection algorithms, the controller 108 may determine the sensitivity of the optical inspection sub-system 102 to the one or more features-of-interest for each of the features-of-interest detection algorithms (e.g., defect detection algorithms) and/or optical detection mode. It is noted herein that any defect detection algorithm known in the art is suitable for implementation in the present invention. In one embodiment, at least one of the detection algorithms may include a MDAT algorithm using a pass-through difference image. In another embodiment, at least one of the detection algorithms may include a difference image filtering algorithm. In another embodiment, at least one of the detection algorithms may include an energy filtering algorithm. Defect detection algorithms are generally described in U.S. patent application Ser. No. 13/685,808, entitled Visual Feedback for Inspection Algorithms and Filters, filed on Nov. 27, 2012, which is incorporated herein by reference in its entirety.

Further, the controller 108 may assign a score (e.g., relative ranking) to each algorithm and optical mode combination. This score may be on a relative ranking of all available results or this score may be a relative ranking based on a comparison to a standardized sensitivity level.

In another embodiment, the controller 108 may report the determined sensitivity of optical inspection sub-system 102 to the one or more features-of-interest 126 for each of the features-of-interest detection procedures to one or more displays 118. For example, the controller 108 may convert the score ranking described previously herein to a color coding scheme. In turn, the controller 108 may present the sensitivity to each algorithm and optical detection mode to a user by displaying color coded results, such as the set of results 180.

In some embodiments, various steps, functions, and/or operations of system 100 (and the following methods) are carried out by one or more of the following: electronic circuits, logic gates, multiplexers, programmable logic devices, ASICs, analog or digital controls/switches, microcontrollers, or computing systems. The controller 108 may include, but is not limited to, a personal computing system, mainframe computing system, workstation, image computer, parallel processor, or any other device known in the art. In general, the term "computing system" is broadly defined to encompass any device having one or more processors 110, which execute instructions from a carrier medium, or memory 112. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape and the like. A carrier medium may include a transmission medium such as a wire, cable, or wireless transmission link.

It should be recognized that the various steps described throughout the present disclosure may be carried out by a single controller (or computer system) or, alternatively, multiple controllers (or multiple computer systems). Moreover, different sub-systems of the system 100, such as the inspection sub-system 102, SEM tool 116 or the additional source 114, may include one or more computing or logic systems suitable for carrying out at least a portion of the steps described above. Therefore, the above description should not be interpreted as a limitation on the present invention but merely an illustration. Further, the controller 108 may be configured to perform any other step(s) of any of the method embodiments described herein.

In another embodiment, the controller 108 may be communicatively coupled to any of the various components or sub-systems of system 100 in any manner known in the art. For example, the controller 108 may be coupled to a computer system of the inspection sub-system 102 or to a computer system of the SEM review tool 116. In another example, two or more of the components or sub-systems of system 100 may be controlled by a single controller. Moreover, the controller 108 may be configured to receive and/or acquire data or information from other systems (e.g., inspection results from an additional inspection system, a remote database including design data and the like) by a transmission medium that may include wireline and/or wireless portions. In this manner, the transmission medium may serve as a data link between the controller 108 and other subsystems of the system 100 or systems external to system 100.

Figure 1G:
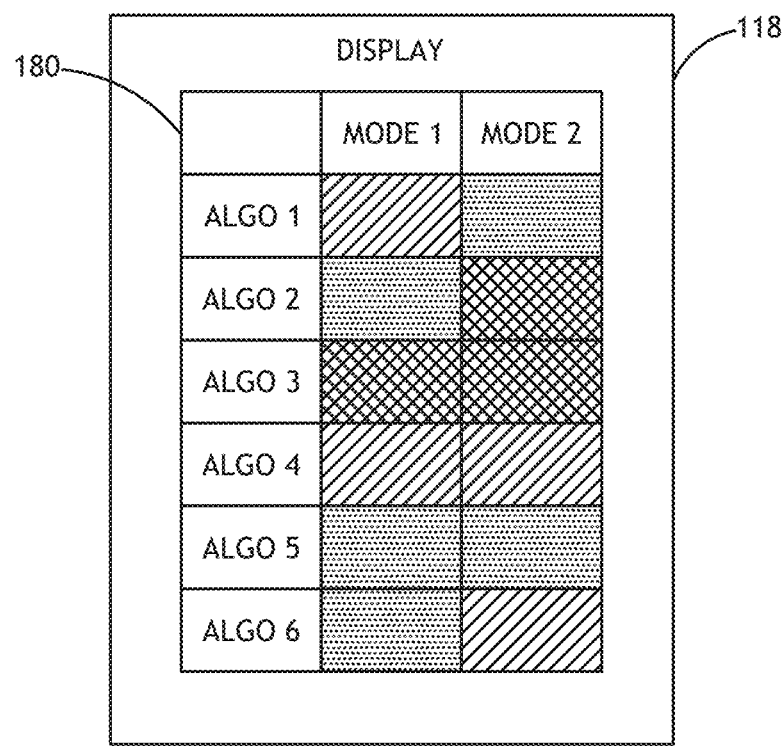
FIG. 1G illustrates a graphical depiction of detection sensitivity results reported on a display, in accordance with the present invention.

FIG. 1G illustrates a conceptual view of a display 118 suitable for displaying an output of the controller 108. For example, the controller 108 may display the sensitivity of optical inspection sub-system 102 to the one or more features-of-interest 126 for each of the features-of-interest detection procedures. For example, the controller 108 may convert a score ranking described further herein to a color coding scheme. In turn, the controller 108 may present the sensitivity to each algorithm and optical detection mode to a user by displaying color coded results, such as the set of results 180 depicted in FIG. 1G.

Figure 1H:
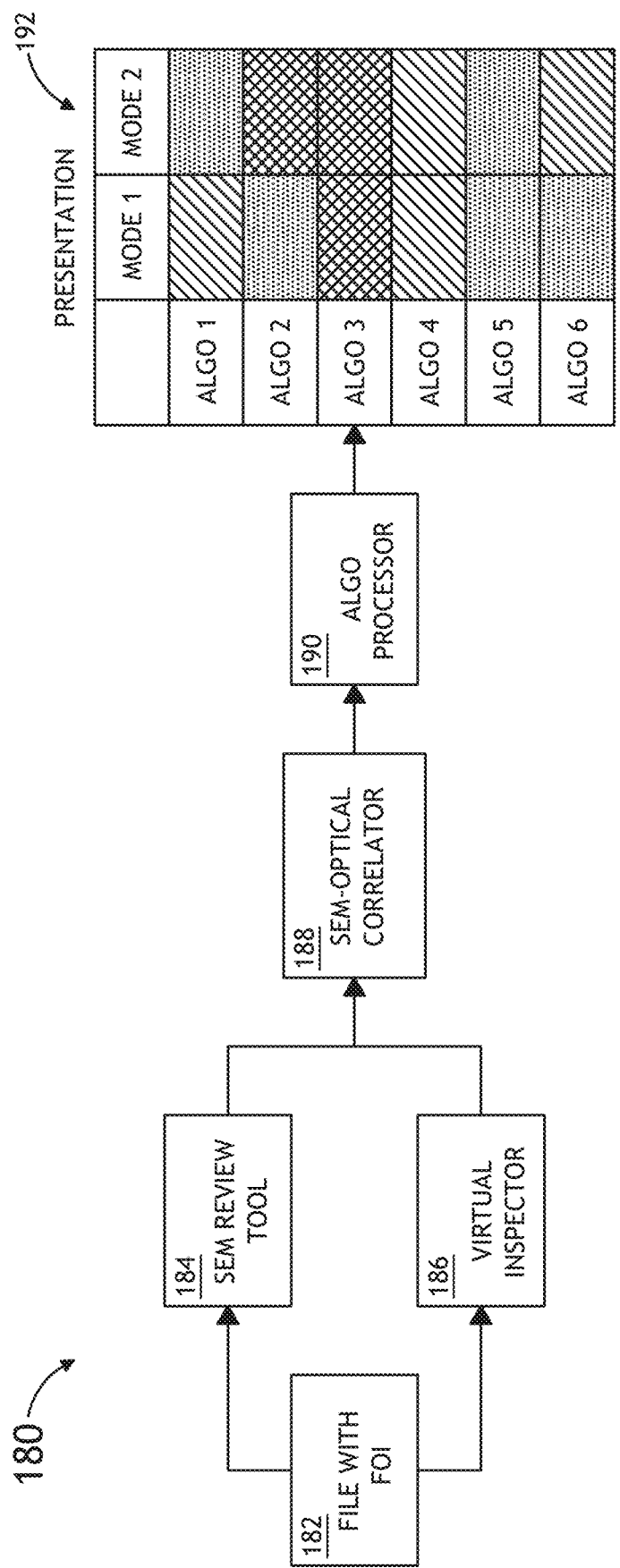
FIG. 1H illustrates a functional block diagram of a system for correlating optical images and scanning electron microscopy images and reporting detection sensitivity results, in accordance with the present invention.

FIG. 1H illustrates a functional block diagram depicting the operational steps of system 100, in accordance with one embodiment of the present disclosure. Applicants note that the functional blocks and the description below thereof are not limitations on the present invention and should be interpreted as illustrative only. In one embodiment, an image file 182 (e.g., KLARF file) including one or more FOIs is provided. Then, a SEM review tool 184 may center on the one or more FOIs. For example, first the SEM review tool 184 may perform a de-skew process. Then, the SEM review tool 184 may run an ADL to detect an EBI feature of interest. In turn, the SEM review may center on the one or more FOIs and grab one or more low magnification images. In addition, a virtual inspector (e.g., VIVA) 186 may grab one or more job dumps utilizing an EBI file (e.g., EBI KLARF file). Then, a SEM-Optical correlator 188 may correlate the images from the SEM review tool 184 and the virtual inspector 186. For example, the SEM-optical correlator 188 may load low magnification images from the SEM review tool 184. Then, the SEM-optical correlator 188 may load job dumps from the virtual inspector 186. In turn, a user may select a FOI location in the one or more low magnification SEM images from the SEM review tool 184. Then, the SEM images from the SEM review tool 184 and the optical images from the virtual inspector 186 are correlated and the location of the FOI is identified in the optical images. In another embodiment, the algorithm processor 190 may process the correlated images to evaluate the sensitivity of defect detection with respect to different defect detection algorithms, associating optical inspection signal to defects. For example, job dumps associated with a variety of algorithms and imaging modes that include the new FOI location are processed with the algorithm processor 190. In another embodiment, the results from the algorithm processor 190 may be presented to a user in presentation 192 (e.g., presentation displayed on display 118), which reports the sensitivity to each algorithm and optical detection mode to a display in terms of a color coded scheme (e.g., see FIG. 1G).

The embodiments of the system 100 illustrated in FIG. 1A may be further configured as described herein. In addition, the system 100 may be configured to perform any other step(s) of any of the method embodiment(s) described herein.

Figure 2A:
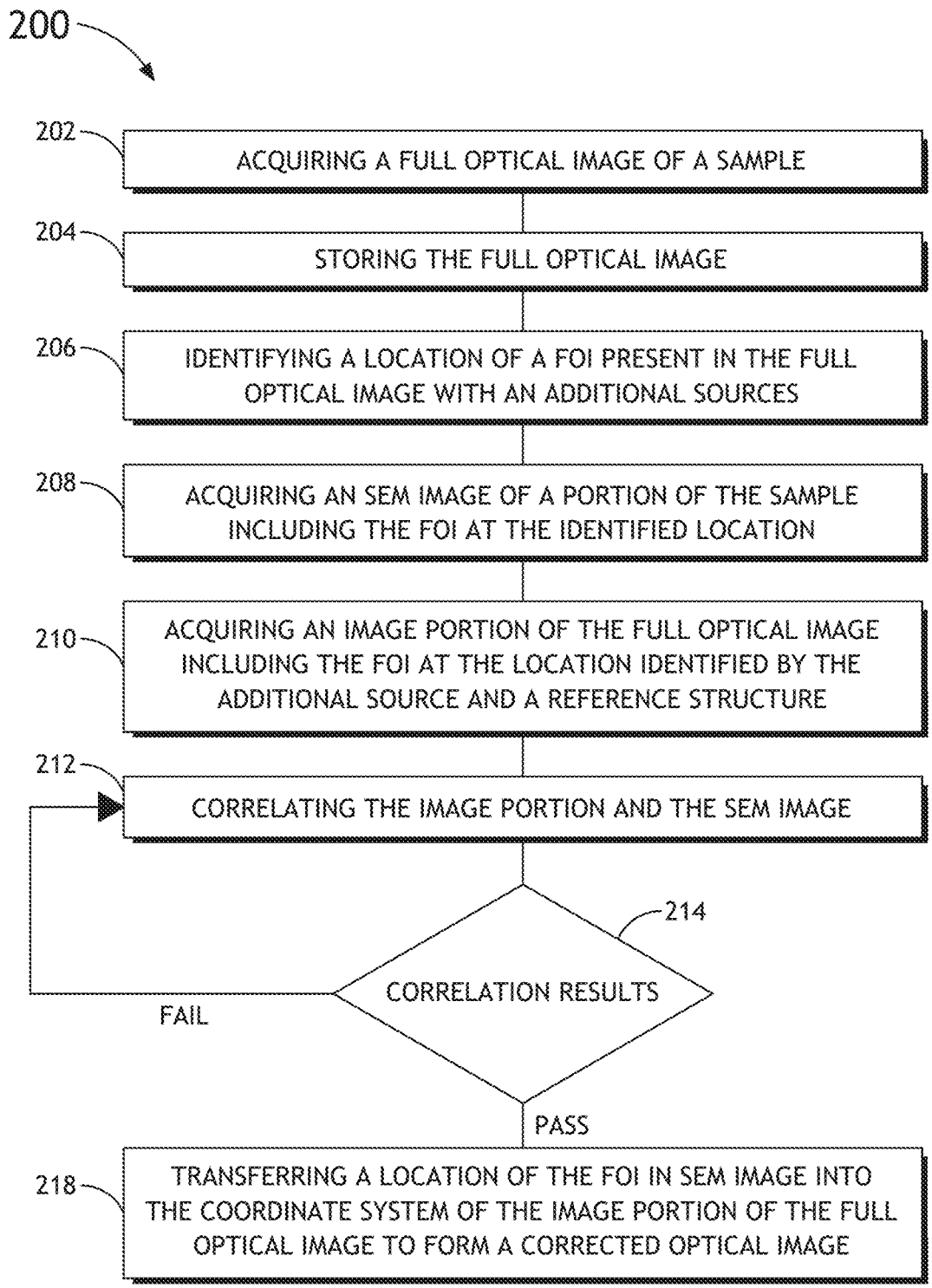
FIG. 2A illustrates a process flow diagram illustrating a method for correlating optical images and scanning electron microscopy images, in accordance with the present invention.

FIG. 2A illustrates a process flow 200 suitable for implementation by the system 100 of the present invention. It is recognized that data processing steps of the process flow 200 may be carried out via a pre-programmed algorithm executed by one or more processors 110 of controller 108.

In step 202, one or more full optical images of a sample are acquired. In one embodiment, as shown in FIGS. 1A and 1B, an optical inspection sub-system 102 may acquire one or more full images 125 of a sample 104 (e.g., wafer) by scanning sample 104. As previously noted herein, the optical inspection sub-system 102 may include a DF inspection tool or a BF inspection tool. Further, the optical inspection sub-system 102 may include a broadband light source (e.g., plasma light source, discharge lamp and the like) or a narrowband light source (e.g., a laser). In another embodiment, the system 100 may carry out a virtual inspection process in order to acquire a full image 125 of sample 104.

In step 204, the one or more full optical images are stored. In one embodiment, as shown in FIGS. 1A and 1B, a full optical image 125 acquired with the optical inspection sub-system 102 is transferred (e.g., via data link) to the controller 108 and stored in memory 112 of controller 108. In this regard, the one or more processors 110 of the system 100 may retrieve stored full image data from memory 112 for processing at a later time. It is recognized herein that the image data from the inspection sub-system 102 may be stored in any format known in the art of wafer inspection. For instance, the one or more full images 125 may be stored in a digital KLARF file. In another embodiment, a full optical image 125 acquired with the optical inspection sub-system 102 is stored on board the optical inspection sub-system 102 (e.g., optical inspection tool).

In step 206, a location of one or more features-of-interest present in the one or more full optical images is identified with one or more additional sources. In one embodiment, as shown in FIGS. 1A and 1B, an additional source 114 may be used to identify a location of a FOI 126 present in the full optical image 125. In another embodiment, a FOI 126 is identified using an additional source 114 that may include, but is not limited to, an electronic beam inspector (eBI), a scanning electron microscopy (SEM) review tool, an electronic test tool and the like. In another embodiment, a FOI 126 is identified using design data. For instance, the FOI 126 may be identified using design data stored in memory and includes design information associated with one or more devices of sample 104. It is further noted herein that the additional source 114 may provide the location data of the one or more features-of-interest 126 in the form of a selected digital file format. For instance, the additional source 114 may provide the location data of the one or more features-of-interest 126 in the form of a selected digital file format (e.g., KLARF file).

In another embodiment, the one or more features-of-interest 126 identified by the additional source 114 may include, but is not limited to, a defect (e.g., particle defect) or a pattern-of-interest (e.g., memory array) associated with the one or more inspected devices of the sample 104.

In step 208, one or more SEM images of a portion of the sample including the one or more features-of-interest at the location identified in step 206 are acquired. In one embodiment, as shown in FIGS. 1A and 1C, a SEM tool 116 (e.g., SEM wafer review tool) acquires a SEM image 130 of a portion of the sample 104 that includes the FOI 126 identified by the additional source 114. For example, after the additional source 114 transmits data indicative of a location of the FOI 126, the SEM tool 116 may scan an area of the wafer that includes the identified FOI 126 (e.g., defect or pattern-of-interest) to form one or more SEM images 130. In this regard, the SEM tool 116 may obtain a high-resolution image 130 of the FOI 126 and the surrounding area.

In one embodiment, upon obtaining the SEM image (or images) 130, the controller 108 (or similar computer control systems) may perform a de-skew process on the image 130 in order to account for a global offset in the image 130.

In another embodiment, the FOI 126 of the sample 104 may be re-detected utilizing an increased magnification field-of-view (FOV). For instance, the SEM tool 116 may 're-detect' the FOI 126 using a high magnification FOV, such as, but not limited to, 2 μm. In another embodiment, controller 108 may automatically direct the SEM tool 116 to perform this re-detection. In another embodiment, a user may manually direct the controller 108 to direct the SEM tool 116 to perform this re-detection by entering a control signal into the controller 108 via user interface 120. In another embodiment, where and/or whether re-detection is carried out may depend on the FOI location accuracy of the additional source 114.

In another embodiment, the FOI 126 may be centered in a high magnification image manually (via user interface 120) or automatically (via controller 108).

In another embodiment, the system 100 may switch the FOV of the SEM image 130 from high magnification to low magnification (e.g., 30 μm) and grab the low magnification images of the FOI 126 and the surrounding area of the sample 104. In one embodiment, the FOV may be automatically switched from the high magnification to low magnification by the controller 108. In another embodiment, the FOV may be manually switched from the high magnification to low magnification by a user making a corresponding selection via user interface 120. It is noted herein that the size of magnification change may depend on the physical size of one or more device features of the sample (e.g., size of SRAM or other memory blocks). It is further noted that since the stage 106 is not moved during the process of switching from low magnification to high magnification a FOI 126 (e.g., defect) that is re-detected with high magnification may stay centered in the low magnification SEM images 130.

In step 210, one or more image portions of the one or more full optical images including the one or more features-of-interest at the location identified in step 206 are acquired. In addition, the one or more image portions include one or more reference structures of the sample. In one embodiment, as shown in FIGS. 1A, 1B and 1D, the controller 108 may acquire an image portion 140 of a full optical image 125 that includes the FOI 126 at the location identified by the additional source 114. In another embodiment, the image portion 140 includes one or more reference structures. For example, the one or more reference structures may include, but are not limited to, a corner of a memory block 142 or a border of a memory block 144 (e.g., SRAM block).

In one embodiment, the system 100 may acquire an image portion 140 of the full optical image 125 that includes the FOI 126 at the location identified by the additional source 114 via the optical inspection sub-system 102. In another embodiment, the controller 108 may grab an image portion 140 from memory 112 (or another memory) that includes the one or more features-of-interest 126 at the location identified by the additional source 114 and one or more reference structures, such as 142, 144 shown in FIG. 1D. For example, the controller 108 may acquire the image portion 140 from a virtual inspection system (not shown). In this regard, the controller 108 may acquire (e.g., acquire from optical sub-system 102 or acquire from virtual inspection system) an image portion 140 of the full image 125 that has an FOV large enough to include an FOI 126 at the location identified by the additional source 114 as well as one or more reference structures, such as 142, 144. In another embodiment, the one or more reference structures present in the image portions 140 are also present in the SEM image 130, allowing the controller 108 to use such identified features to correlate the images 130, 140, as discussed further herein.

In step 212, the one or more image portions and the one or more scanning electron microscopy images are correlated. In one embodiment, the one or more image portions and the one or more SEM images are correlated based on the presence of at least one of the one or more features-of-interest and the one or more reference structures in both the one or more image portions and the one or more scanning electron microscopy images. In one embodiment, as shown in FIGS. 1A, 1E and 1F, the controller 108 may correlate the image portion 140 with the SEM image 130. FIG. 1E depicts the SEM image 130 acquired with the SEM tool 116 superposed onto the image portion 140 of the full image 125 acquired with the optical inspection sub-system 102. FIG. 1F depicts the alignment of the image portion 140 (or optical job jump) of the full optical image 125 and the SEM image 130.

In step 214, correlation results from step 212 may be checked. For example, the correlation results may be checked against a preprogrammed standard maintained by controller 108. In the case where the correlation results from step 212 are not satisfactory, the process 200 may repeat the correlation step 212. In the case where the correlation results from step 212 are satisfactory, the process 200 may move onto step 218.

In step 218, a location of the one or more features-of-interest in the one or more scanning electron microscopy images is transferred into the coordinate system of the one or more image portions of the one or more full optical images to form one or more corrected optical images. For example, as shown in FIGS. 1A and 1F, controller 108 may transfer a location of an FOI 126 in a SEM image 130 into the coordinate system for the image portion 140 of the full optical image 125 to form a corrected optical image. In one embodiment, the controller 108 may form a new image file (e.g., KLARF file) that includes the corrected locations of the one or more features-of-interest (e.g., defects).

In a further step, not depicted in FIG. 2A, the one or more corrected optical images may be processed with a plurality of features-of-interest detection procedures. In another embodiment, the controller 108 may determine a sensitivity of the optical inspection sub-system to the one or more features-of-interest for each of the features-of-interest detection procedures and/or optical detection mode. For example, the controller 108 may apply multiple defect detection algorithms to the corrected images. Further, based on the application of the multiple defect detection algorithms, the controller 108 may determine the sensitivity of the optical inspection sub-system 102 to the one or more features-of-interest for each of the features-of-interest detection algorithms (e.g., defect detection algorithms) and/or optical detection mode. In another embodiment, the controller 108 may assign a score (e.g., relative ranking) to each algorithm and optical mode combination. This score may be on a relative ranking of all available results or this score may be a relative ranking based on a comparison to a standardized sensitivity level.

Figure 2B:
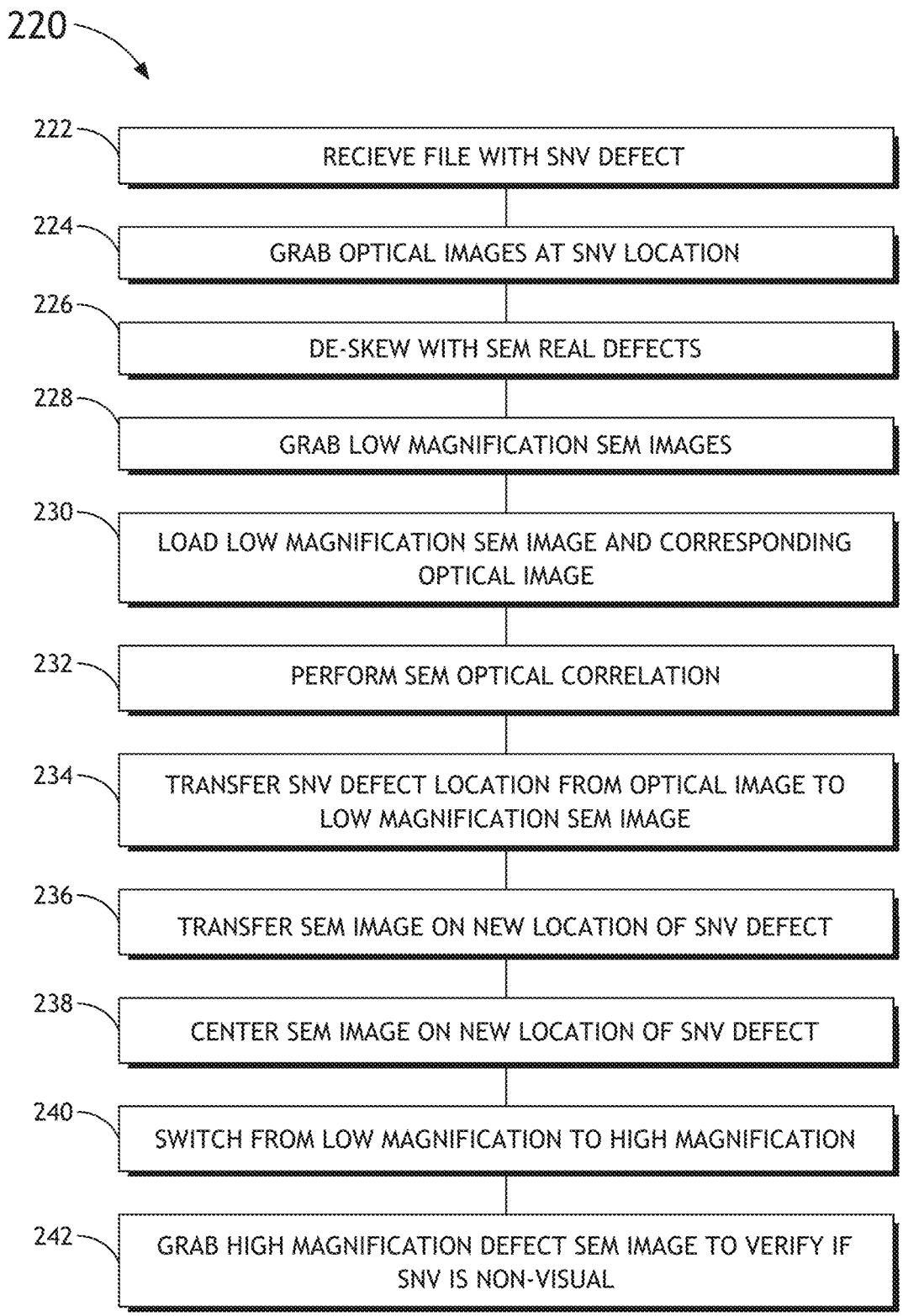
FIG. 2B illustrates a process flow diagram illustrating a method for correlating optical images and scanning electron microscopy images, in accordance with the present invention.

FIG. 2B illustrates a process flow 220 suitable for implementation by the system 100 of the present invention. It is recognized that data processing steps of the process flow 220 may be carried out via a pre-programmed algorithm executed by the controller 108 or by one or more processing elements (e.g., processors) on the SEM tool 116. It is noted herein that the process flow 220 may represent a modified version of the process flow 200, described previously herein. Process flow 220 depicts a process that may be used to verify whether optically real defects, which appear as SEM non-visual (SNV) defects, detected by an optical tool are, in fact, SNV defects. In addition, the process flow 220 may be used to verify that the defect location on the SEM review tool is accurate.

In step 222, one or more files with a SEM non-visual (SNV) defect are received. For example, one or more files (e.g., KLARF files) containing one or more defects classified as SNV defects may be received by the controller 108 from the optical inspection sub-system 102.

In step 224, one or more optical images are grabbed. For example, optical images (e.g., job dumps from full optical image 125) are grabbed with the optics used to inspect the sample 104 at the SNV defect locations to be verified.

In step 226, a de-skew process is performed with the SEM real defects in order to account for a global offset. For example, a de-skew process is performed on the SEM tool 116 with the SEM real defects in order to account for a global offset. In one embodiment, a source image file (e.g., KLARF file) generated by optical inspection sub-system 102 may be used to find multiple defect locations across a wafer that are visible on the SEM review tool in order to account for the global offset between optical inspection subsystem 102 and SEM review tool 116. Following this de-skew process, defects from the optical inspection subsystem 102 are assumed to be within a certain Field-of-view (FOV)

(e.g., 1 μm or 3 μm), which depends on the combined stage accuracy uncertainty of the optical inspection subsystem 102 and SEM review tool 116. It is noted herein that with this stage accuracy uncertainty, a user may be uncertain as to the location of the detected pixel in the SEM image in the event no outstanding SEM real defect is present in the SEM image. Further, a user may conclude that the defect was not visible in the SEM image because of the FOV used to take the SEM image.

In step 228, one or more low magnification SEM images are grabbed. For example, one or more low magnification (e.g., 30 μm) SEM images are grabbed at the one or more SNV defect locations with the SEM tool 116. In step 230, one or more low magnification SEM images and corresponding one or more optical images are loaded by the SEM tool 116. In one embodiment, the SEM tool 116 may automatically load one or more low magnification SEM images and corresponding one or more optical images. In another embodiment, the SEM tool 116 may load one or more low magnification SEM images and corresponding one or more optical images in response to a user selection via user interface 120.

In step 232, a SEM-optical image correlation is performed on the loaded one or more low magnification SEM images and the corresponding one or more optical images. In step 234, the SNV defect location is transferred from the one or more optical images to the low magnification SEM image. In step 236, the one or more SEM images are transferred onto the new location of the SNV defect.

In step 238, the one or more SEM images are centered on the new location of the SNV defect at low magnification. In step 240, the SEM review tool 116 may be switched from low magnification to high magnification in order to grab one or more high magnification SEM images. In step 242, one of more high magnification SEM images are grabbed by the SEM review tool 116 in order to verify whether the one or more SNV defects are non-visual.

Figure 3:
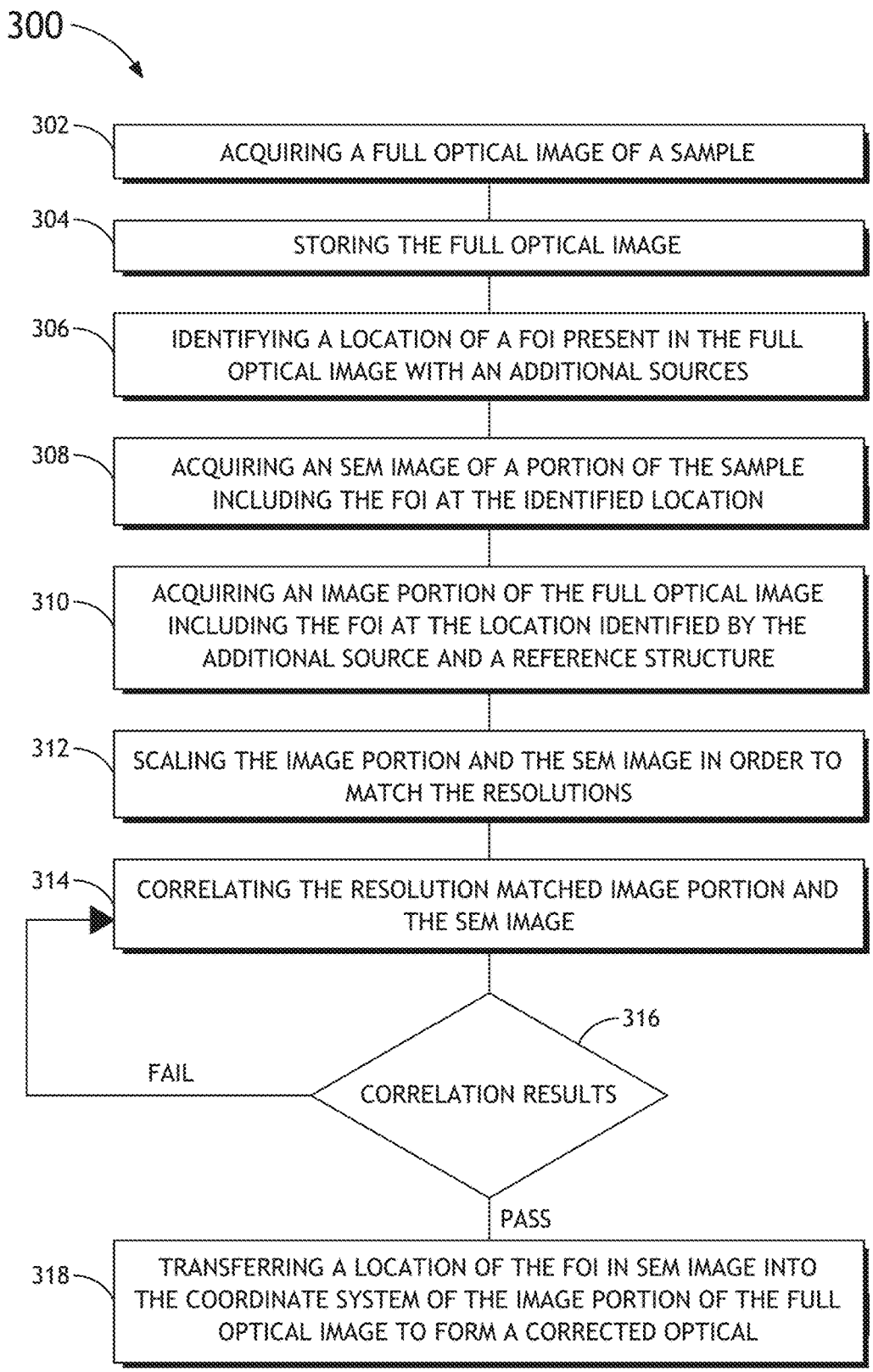
FIG. 3 illustrates a process flow diagram illustrating a method for correlating optical images and scanning electron microscopy images, in accordance with the present invention.

FIG. 3 illustrates a process flow 300 suitable for implementation by the system 100 of the present invention. It is recognized that data processing steps of the process flow 300 may be carried out via a pre-programmed algorithm executed by one or more processors 110 of controller 108. In the spirit of descriptive expedience, the steps described previously herein in process flow 200 or 220 are not described further herein in the description of process flow 300. As such, the steps and embodiments described previously herein should be interpreted to the process flow 300 and the pertinent process flow steps.

In step 302, one or more full optical images of a sample are acquired. In step 304, the one or more full optical images are stored. In step 306, a location of one or more features-of-interest present in the one or more full optical images is identified with one or more additional sources. In step 308, one or more SEM images of a portion of the sample including the one or more features-of-interest at the location identified in step 306 are acquired. In step 310, one or more image portions of the one or more full optical images including the one or more features-of-interest at the location identified in step 306 are acquired.

In step 312, the one or more image portions and/or the one or more scanning electron microscopy images are scaled in order to substantially match the resolution of the one or more image portions with the resolution of the one or more scanning electron microscopy images. For example, as shown in FIG. 1A, the controller 108 may rescale the image portion 140 of the full wafer image 125 and/or the SEM image 130 such that the pixel sizes for both images match (e.g., match within a selected level). For instance, the controller 108 may operate on a 'zoomed out' SEM image 130 containing an FOI 126 to scale the SEM image 130 down. In addition, the controller 108 may operate on an image portion 140 of the full wafer image 125 to scale the image portion 140 up. In this regard, the SEM image 130 and/or the image portion 140 may be scaled down or up such that they match.

In step 314, the resolution-matched one or more image portions and the one or more scanning electron microscopy images are correlated based on the presence of at least one of the one or more features-of-interest and the one or more reference structures in both the one or more image portions and the one or more scanning electron microscopy images.

In one embodiment, the resolution-matched one or more image portions and the one or more SEM images are correlated based on the presence of at least one of the one or more features-of-interest and the one or more reference structures in both the one or more image portions and the one or more scanning electron microscopy images. In one embodiment, the controller 108 may correlate the resolution-matched image portion 140 with the SEM image 130. It is noted herein that the appearance of the low-resolution optical images may be very different from the high-resolution images. Identification and extraction of special features in the image may be necessary to correctly localize the corresponding features in the high-resolution image. In one embodiment, prior to the formation of the one or more corrected optical images, the defect location or pattern-of-interest in the one or more SEM images 130 is manually identified or automatically re-detected (assuming center of low Mag SEM image or through algorithm) and its location is transferred to the optical images In step 316, correlation results from step 314 may be checked. For example, the correlation results may be checked against a preprogrammed standard maintained by controller 108. In the case where the correlation results from step 314 are not satisfactory, the process 300 may repeat the correlation step 314. In the case where the correlation results from step 314 are satisfactory, the process 300 may move onto step 318.

In step 318, a location of the one or more features-of-interest in the one or more scanning electron microscopy images is transferred into the coordinate system of the one or more image portions of the one or more full optical images to form one or more corrected optical images.

In a further step, an inspection care area is generated based on the translated location of the one or more features-of-interest in the one or more corrected optical images.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be carried out (e.g., hardware, software, and/or firmware), and that the preferred vehicle will vary with the context in which the processes and/or systems and/or other technologies are deployed.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a display device, a memory such as volatile and non-volatile memory, processors such as microprocessors and digital signal processors, computational entities such as operating systems, drivers, graphical user interfaces, and application programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed:

1. A method for correlating optical images with scanning electron microscopy images comprising:
    acquiring one or more full optical images of a sample by scanning the sample with an optical inspection sub-system;
    identifying a location of one or more features-of-interest present in the one or more acquired full optical images with one or more additional sources different from the optical inspection sub-system;
    upon the identifying the location of one or more features-of-interest, acquiring one or more scanning electron microscopy images of a portion of the sample including the one or more features-of-interest at the identified location with a scanning electron microscopy tool and acquiring one or more image portions of the one or more full optical images including the one or more features-of-interest at the location identified by the one or more additional sources, the one or more image portions including one or more reference structures;
    upon acquiring the one or more scanning electron microscopy images of a portion of the sample and one or more image portions of the one or more full optical images including the one or more features-of-interest, correlating the one or more image portions and the one or more scanning electron microscopy images based on the presence of at least one of the one or more features-of-interest and the one or more reference structures in both the one or more image portions and the one or more scanning electron microscopy images; and
    transferring a location of the one or more features-of-interest in the one or more scanning electron microscopy images into the coordinate system of the one or more image portions of the one or more full optical images to form one or more corrected optical images.

2. The method of claim 1, further comprising:
    processing the one or more corrected optical images with a plurality of features-of-interest detection procedures; and
    determining sensitivity of the optical inspection sub-system to the one or more features-of-interest for each of the features-of-interest detection procedures.

3. The method of claim 2, further comprising:
    reporting the determined sensitivity of optical inspection sub-system to the one or more features-of-interest for each of the features-of-interest detection procedures to one or more displays; and
    receiving a user selection of one or more of the displayed features-of-interest detection procedures.

4. The method of claim 1, wherein the storing the one or more full optical images comprise:
    storing the one or more full optical images in memory.

5. The method of claim 1, wherein the one or more features comprise:
    at least one of a defect and a pattern-of-interest.

6. The method of claim 1, wherein the one or more additional sources comprise:
    at least one of an electron beam inspector (eBI), a scanning electron microscope (SEM) tool and an electronic-test tool.

7. The method of claim 1, wherein the one or more additional sources comprise:
    design data stored in a memory.

8. The method of claim 1, wherein the acquiring one or more image portions including the one or more features-of-interest at the location identified by the one or more additional sources and the one or more reference structures comprises:
    acquiring one or more image portions having a field of view including one or more reference structures and the one or more features-of-interest at the location identified by the one or more additional sources.

9. The method of claim 8, wherein the one or more reference structures comprise:
    a portion of a memory block.

10. The method of claim 1, wherein the acquiring one or more image portions including the one or more features-of-interest at the location identified by the one or more additional sources and one or more reference structures comprises:
    grabbing from a memory one or more image portions including the one or more features-of-interest at the location identified by the one or more additional sources and one or more reference structures.

11. The method of claim 1, wherein the optical inspection sub-system comprises:
    at least one of a broadband optical inspection tool and a narrowband optical inspection tool.

12. A method for correlating optical images with scanning electron microscopy images comprising:
    acquiring one or more full optical images of a sample by scanning the sample with an optical inspection sub-system;
    identifying a location of one or more features-of-interest present in the one or more acquired full optical images with one or more additional sources different from the optical inspection sub-system;

upon the identifying the location of one or more features-of-interest, acquiring one or more scanning electron microscopy images of a portion of the sample including the one or more features-of-interest at the identified location with a scanning electron microscope (SEM) tool and acquiring one or more image portions of the one or more full optical images including the one or more features-of-interest at the location identified by the one or more additional sources, the one or more image portions including one or more reference structures;

upon acquiring the one or more scanning electron microscopy images of a portion of the sample and one or more image portions of the one or more full optical images including the one or more features-of-interest, scaling at least one of the one or more image portions and the one or more scanning electron microscopy images in order to substantially match the resolution of the one or more image portions with the resolution of the one or more scanning electron microscopy images;

correlating the resolution matched one or more image portions and the one or more scanning electron microscopy images based on the presence of at least one of the one or more features-of-interest and the one or more reference structures in both the one or more image portions and the one or more scanning electron microscopy images; and transferring a location of the one or more features-of-interest in the one or more scanning electron microscopy images into the coordinate system of the one or more image portions of the one or more full optical images to form one or more corrected optical images.

13. The method of claim 12, further comprising:
processing the one or more corrected optical images with a plurality of features-of-interest detection procedures; and
determining the sensitivity of the optical inspection sub-system to the one or more features-of-interest for each of the features-of-interest detection procedures.

14. The method of claim 13, further comprising:
reporting the determined sensitivity of optical inspection sub-system to the one or more features-of-interest for each of the features-of-interest detection procedures to one or more displays; and
receiving a user selection of one or more of the displayed features-of-interest detection procedures.

15. The method of claim 12, further comprising:
generating an inspection care area based on the transferred location of the one or more features-of-interest in the one or more corrected optical images.

16. The method of claim 12, wherein the storing the one or more full optical images comprise:
storing the one or more full optical images in memory.

17. The method of claim 12, wherein the one or more features comprise:
at least one of a defect and a pattern-of-interest.

18. The method of claim 12, wherein the one or more additional sources comprise:
at least one of an electron beam inspector (eBI), a scanning electron microscope (SEM) tool and an electronic-test tool.

19. The method of claim 12, wherein the one or more additional sources comprise:
design data stored in a memory.

20. The method of claim 12, wherein the acquiring one or more image portions including the one or more features-of-interest at the location identified by the one or more additional sources and the one or more reference structures comprises:
acquiring one or more image portions having a field of view including the one or more features-of-interest at the location identified by the one or more additional sources and one or more reference structures.

21. The method of claim 12, wherein the one or more reference structures comprise:
a portion of a memory block.

22. The method of claim 12, wherein the acquiring one or more image portions including the one or more features-of-interest at the location identified by the one or more additional sources and one or more reference structures comprises:
grabbing from a memory one or more image portions including the one or more features-of-interest at the location identified by the one or more additional sources and one or more reference structures.

23. The method of claim 12, wherein the optical inspection sub-system comprises:
at least one of a broadband optical inspection tool and a narrowband optical inspection tool.

24. A system for correlating optical images with scanning electron microscopy images comprising:
an optical inspection sub-system for acquiring one or more optical inspection images from a surface of a wafer;
a scanning electron microscopy tool for acquiring one or more measurement inspection images from the surface of the wafer; and
a controller communicatively coupled to at least one of the optical inspection sub-system and the scanning electron microscopy tool, the controller including one or more processors configured to execute a set of programmed instructions, the programmed instructions configured to cause the one or more processors to:
acquire one or more full optical images of a sample by scanning the sample with the optical inspection sub-system;
identify a location of one or more features-of-interest present in the one or more acquired full optical images with one or more additional sources different from the optical inspection sub-system;
upon the identifying the location of one or more features-of-interest, acquire one or more scanning electron microscopy images of a portion of the sample including the one or more features at the identified location with the scanning electron microscopy tool and acquire one or more image portions of the one or more full optical images including the one or more features-of-interest at the location identified by the one or more additional sources, the one or more image portions including one or more reference structures;
upon acquiring the one or more scanning electron microscopy images of a portion of the sample and one or more image portions of the one or more full optical images including the one or more features-of-interest, correlate the one or more image portions and the one or more scanning electron microscopy images based on the presence of at least one of the one or more features-of-interest and the one or more reference structures in both the one or more image portions and the one or more scanning electron microscopy images; and transfer a location of the one or more features-of-interest in the one or more scanning electron microscopy images into the coordinate system of the one or more image portions of the one or more full optical images to form one or more corrected optical images.

\* \* \* \* \*